(12) United States Patent
Hill

(10) Patent No.: US 6,727,992 B2
(45) Date of Patent: Apr. 27, 2004

(54) METHOD AND APPARATUS TO REDUCE EFFECTS OF SHEARED WAVEFRONTS ON INTERFEROMETRIC PHASE MEASUREMENTS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 10/179,556

(22) Filed: Jun. 24, 2002

(65) Prior Publication Data

US 2003/0007158 A1 Jan. 9, 2003

Related U.S. Application Data

(60) Provisional application No. 60/303,545, filed on Jul. 6, 2001.

(51) Int. Cl.[7] .................................................. G01B 9/02
(52) U.S. Cl. ........................................ 356/492; 356/493
(58) Field of Search .................................. 356/492–493

(56) References Cited

U.S. PATENT DOCUMENTS

| | | | |
|---|---|---|---|
| 4,358,201 A | 11/1982 | Makosch | 356/351 |
| 4,688,940 A | 8/1987 | Sommargren et al. | 356/349 |
| 5,923,425 A | * 7/1999 | Dewa et al. | 356/520 |

* cited by examiner

*Primary Examiner*—Frank G. Font
*Assistant Examiner*—Phil Natividad
(74) *Attorney, Agent, or Firm*—Fish & Richardson P.C.

(57) ABSTRACT

The present invention features an anamorphic apparatus that alters a wavefront of a beam having a wavefront error to form a beam comprising a region having a greatly reduced wavefront error. A beam stop may be used with the anamorphic apparatus to define a portion of the region having a greatly reduced wavefront error that is subsequently detected or launched into a fiber optic. Furthermore, the anamorphic apparatus can be incorporated into an interferometry system to reduce errors associated with wavefront error and beam shear, i.e., non-cyclic non-linearities.

27 Claims, 9 Drawing Sheets

METHOD AND APPARATUS TO REDUCE EFFECTS OF SHEARED WAVEFRONTS ON INTERFEROMETRIC PHASE MEASUREMENTS

CROSS-REFERENCE TO RELATED APPLICATIONS

This application claims priority to provisional application Ser. No. 60/303,545 filed Jul. 6, 2001 entitled "METHOD AND APPARATUS TO REDUCE THE EFFECTS OF SHEARED WAVEFRONTS ON INTERFEROMETRIC PHASE MEASUREMENTS" by Henry A. Hill.

BACKGROUND OF THE INVENTION

This invention relates to interferometers, e.g., displacement measuring and dispersion interferometers that measure angular and linear displacements of a measurement object such as a mask stage or a wafer stage in a lithography scanner or stepper system, and also interferometers that monitor wavelength and determine intrinsic properties of gases.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change corresponding to a distance change L of $\lambda/(np)$, where L is a round-trip distance change, e.g., the change in distance to and from a stage that includes the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used to convert the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged. In addition to the extrinsic dispersion measurement, the conversion of the optical path length to a physical length requires knowledge of an intrinsic value of the gas. The factor $\Gamma$ is a suitable intrinsic value and is the reciprocal dispersive power of the gas for the wavelengths used in the dispersion interferometry. The factor $\Gamma$ can be measured separately or based on literature values.

Unfortunately, imperfections in the interferometry system may degrade the accuracy of such interferometric measurements. For example, many interferometers include non-linearities such as what are known as "cyclic errors." The cyclic errors can be expressed as contributions to the phase and/or the intensity of the measured interference signal and have a sinusoidal dependence on phase changes associated with changes in optical path length pnL and/or on phase changes associated with other parameters. In particular, there is first harmonic cyclic error in phase that has a sinusoidal dependence on $(2\pi pnL)/\lambda$ and there is second harmonic cyclic error in phase that has a sinusoidal dependence on $2(2\pi pnL)/\lambda$. Higher harmonic cyclic errors may also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam. Moreover, in many interferometry systems beam shear changes as the position or angular orientation of the measurement object changes. For example, a change in relative beam shear can be introduced by a lateral displacement of a retroreflector measurement object or by a change in the angular orientation of a plane mirror measurement object. Accordingly, a change in the position or angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

SUMMARY OF THE INVENTION

The present invention features an anamorphic apparatus that alters a wavefront of a beam having a wavefront error to form a beam comprising a region having a greatly reduced wavefront error. A beam stop may be used with the anamorphic apparatus to define a portion of the region having a greatly reduced wavefront error that is subsequently detected or launched into a fiber optic. Furthermore, the anamorphic apparatus can be incorporated into an interferometry system to reduce errors associated with wavefront error and beam shear, i.e., non-cyclic non-linearities.

In one set of embodiments, an anamorphic apparatus is used to alter the wavefront of a beam in a direction substantially parallel to the plane of the wavefront to reduce effects of changes in beam shear in that direction. In another set of embodiments of the present invention, an anamorphic apparatus is used to alter the wavefront of a beam in two orthogonal directions that are substantially parallel to the plane of the wavefront to reduce effects of changes in beam shear in the two orthogonal directions. Furthermore, in additional embodiments, a series of two or more anamorphic cells can be cascaded with one another to further reduce the effects of changes in beam shear.

In general, in one aspect, the invention features an interferometry system including an interferometer, a detector, and an anamorphic system. During operation, the interferometer directs a reference beam along a reference path and a measurement beam along a measurement path, and then recombines at least a portion of each of the beams to form an overlapping pair of exit beams. The detector measures an interference signal derived from the overlapping pair of exit beams. The anamorphic system is positioned to received the overlapping pair of exit beams and reduce the effects of relative beam shear and wavefront errors on the interference signal measured by the detector.

Embodiments of the invention may include any of the following advantages.

The amplitude of a detected interferometric signal from an interferometric system incorporating the anamorphic apparatus will depend only weakly on the beam shear between the reference and measurement beam components of the output beam, thereby improving the accuracy of the interferometric signal. Furthermore, by reducing the wavefront error in the output beam, the output beam can be more consistently coupled to a detector through an optical fiber. Moreover, interferometry systems using the anamorphic apparatus can be advantageously used for microlithography and beam writing applications.

Other features and advantages will be apparent from the following detailed description and from the claims.

BRIEF DESCRIPTION OF THE FIGURES

Like reference symbols in the various drawings indicate like elements.

DETAILED DESCRIPTION

Non-cyclic non-linearities can degrade accuracy of displacement and/or dispersion measurements extracted from interferometric data. The non-cyclic non-linearities can be the result of a change in relative beam shear of reference and measurement beam components of an output beam of an interferometer wherein the beam components have wavefront errors. The wavefront errors can arise from imperfections in a light source of the input beam, imperfections in beam relay optics used for transport of a beam from the light source to an interferometer, and imperfections in the interferometer and detector optics. Although it might be possible to minimize causes of such non-cyclic non-linearities, one aspect of the present invention proposes to improve the accuracy of the interferometric measurement by reducing the effects of wavefront errors that are associated with certain of the non-cyclic non-linearities. Apparatus that provides such a feature and interferometery systems that incorporate such apparatus will now be described generally, and thereafter, more specific embodiments will be described in greater detail.

Figure 1:
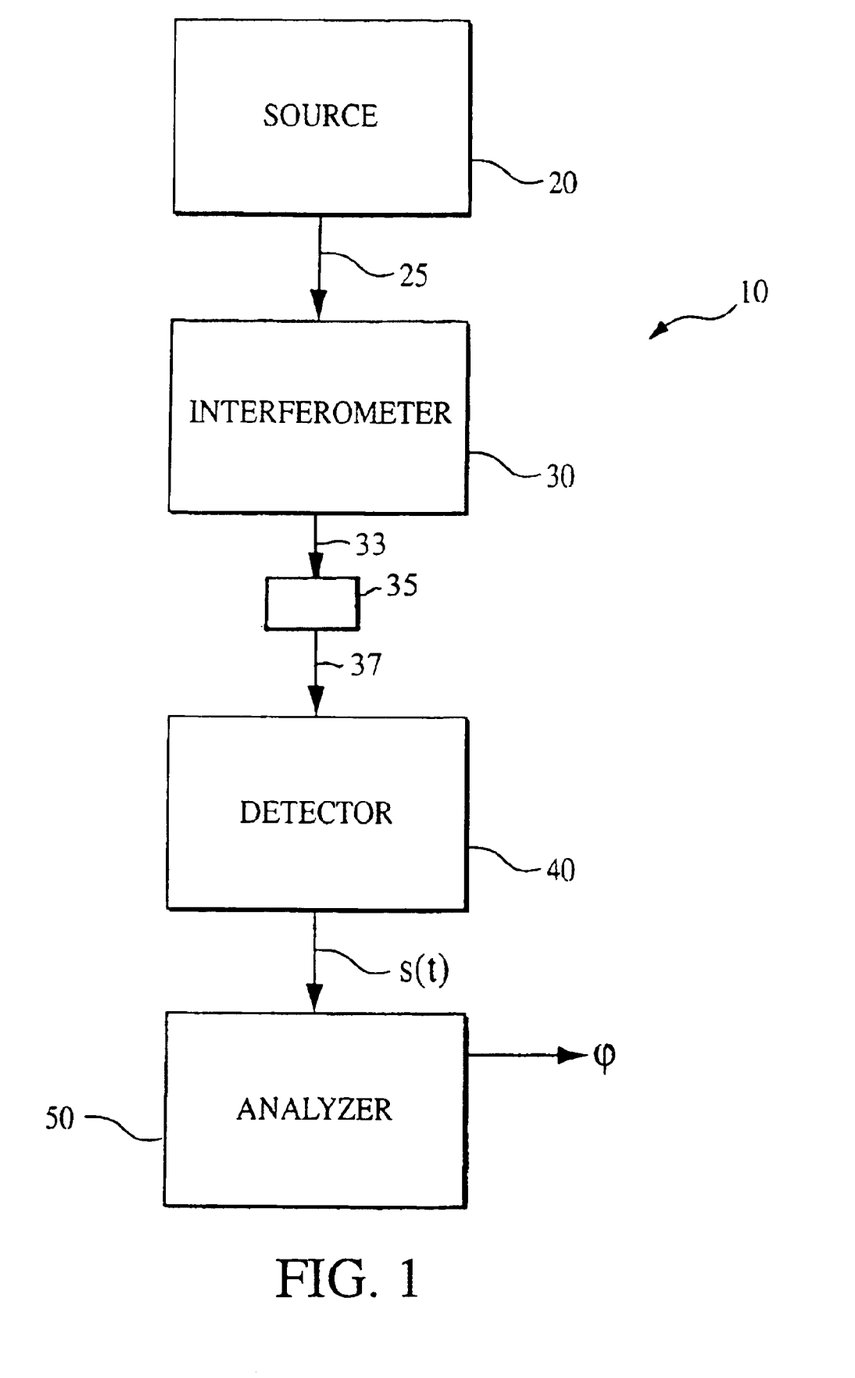
FIG. 1 is a schematic diagram of an interferometry system incorporating an anamorphic apparatus to reduce non-cyclic non-linearities.

Referring to FIG. 1, an interferometry system 10 includes a source 20, an interferometer 30, an anamorphic apparatus 35, a detector 40, and an analyzer 50. Source 20 includes a laser for providing one or more beams 25 to interferometer 30. For dispersion interferometry, beams 25 include at least two beams at different wavelengths, e.g., 1064 nm and 532 nm. For optical path displacement measurements, a single wavelength is sufficient. When using heterodyne interferometry techniques at one or more different wavelengths, source 20 introduces a frequency splitting between components of each beam at the one or more different wavelengths. For example, one or more acousto-optical modulators can be used to introduce the frequency splitting, or alternatively, the source can include a Zeeman-split laser to produce the frequency splitting. Often the frequency-split components are made to have orthogonal polarizations. The frequency-split components of beam 25 can be sent to interferometer 30 where they are separated in interferometer 30 into measurement and reference beams.

Interferometer 30 can be any type of interferometer, e.g., a differential plane mirror interferometer, a double-pass interferometer, a Michelson-type interferometer, or an interferometer with a dynamic beam steering element. The interferometer can be designed to monitor, for example, changes in optical path length, changes in physical path length, changes in refractive index, changes in wavelength of a beam, changes in direction of propagation of a beam, or changes in intrinsic gas properties along a path length. The interferometer directs a reference beam along a reference path (which may contact a reference object) and a measurement beam along a measurement path contacting a measurement object (e.g., a lithography stage), and then combines the reference and measurement beams to form an overlapping pair of exit beams 33. In dispersion interferometry applications, there are overlapping pairs of exit beams for each of the different wavelengths.

The interference between the overlapping pair of exit beams contains information about the relative difference in optical path length between the reference and measurement paths. In some embodiments, the reference path is fixed and therefore changes in the optical path length difference correspond to changes in the optical path length of the measurement path. In other embodiments, however, the optical path length of both the reference and measurement paths can be changing. For example, the reference path can contact a reference object (e.g., a column reference) that may move relative to the interferometer. In this latter case, the changes in the optical path length difference correspond to changes in the position of the measurement object relative to the reference object.

Beam 33 comprising reference and measurement beams exits interferometer 30 and is transmitted by anamorphic system 35 as beam 37. The details of anamorphic system 35 are described in greater detail further below.

When the reference and measurement beams have orthogonal polarizations, the intensity of at least one intermediate polarization of the overlapping pair of exit beams is selected to produce the optical interference. For example, a polarizer can be positioned within detector 40. The detector 40 measures the intensity of the selected polarization of the overlapping pair of exit beams to produce the interference signal. Portions of the beams can be combined with one another before being directed along the reference and measurement paths to provide a reference pair of overlapping exit beams, which is used to provide a reference interference signal. Furthermore, in some embodiments, a polarizer is included in the anamorphic system 35, and beam 37 emerges as a mixed beam having the selected polarization.

Detector 40 includes a photodetector, which measures preferably by a quantum photon detector the intensity of the overlapping pair of exit beams having the selected polarization, and electronics such as a preamplifier and an analog-to-digital converter, which amplify the output from the photodetector and produce a digital signal s(t) corresponding to the optical interference. In dispersion interferometry applications, digital signals s(t) are produced for each of the overlapping pair of exit beams (which correspond to different wavelengths) by using multiple photodetection channels within detector 40. Detector 40 may also include an optical fiber (not shown) to couple beam 37 to the photodetector.

The signal s(t), absent any non-linearities and ignoring a constant offset intensity, can be expressed as $s(t)=a\cos(\omega t+\phi+\zeta)$, where $\phi=Lkn$, L is the physical path length difference between the reference and measurement paths, k is the wavenumber of the measurement beam, n is the refractive index within the interferometer, $\omega$ is the angular split-frequency difference between the measurement and reference beams before introduction of any Doppler shift, t is time, a is an amplitude that is constant with respect to $\phi$ and $\zeta$ is a phase offset that is constant with respect to $\phi$ and $\dot\phi$, where $\dot\phi$ is the first derivative of $\phi$ with respect to time. In homodyne applications, the split-frequency difference between beam components in the expression for s(t) is zero, i.e. $\omega=0$, and to accurately separate background signal from the optical interference, detector 40 includes multiple photodetection channels to measure interference for multiple phase offsets, the phase offsets being introduced within detector 40.

The signal s(t) is sent to analyzer 50, which extracts phase $\phi=Lkn$ from s(t) using a reference phase provided by the source of the heterodyne frequency split difference or the reference interference signal. The analyzer can determine changes in the optical length difference between the measurement and reference paths. Furthermore, using the signals corresponding to additional wavelengths, the analyzer can make dispersion measurements, determine physical path length difference measurements, determine changes in direction of propagation of a beam, and/or measure intrinsic properties of the gas in the measurement path.

Analyzer 50 includes a computer or digital processor for performing the phase extraction. For example, the numerical and symbolic steps described herein can be converted into a digital program executed, e.g., on a digital signal processor (DSP) according to methods well known in the art. The digital program can be stored on a computer readable medium such as a hard disk and can be executable by the computer processors in the analyzer. Alternatively, the appropriate analysis steps can be converted into a digital program that is hardwired into dedicated electronic circuits within the analyzer that executes the steps. Methods for generating such dedicated electronic circuits based on a given numerical or symbolic analysis procedure are also well known in the art.

Anamorphic apparatus 35 includes one or more cells that introduce a lateral shear of a first component of an input beam relative to a second component of the input beam. The cells may incorporate phase plates comprising crystals, e.g. uniaxial crystals such as $TeO_2$ and $YVO_4$, a Mach Zehnder interferometer comprising polarizing beam splitters, or Fabre-Perot etalons wherein the etalons are constructed using a birefringent material such as quartz, $TeO_2$, or $YVO_4$.

Figure 2A:
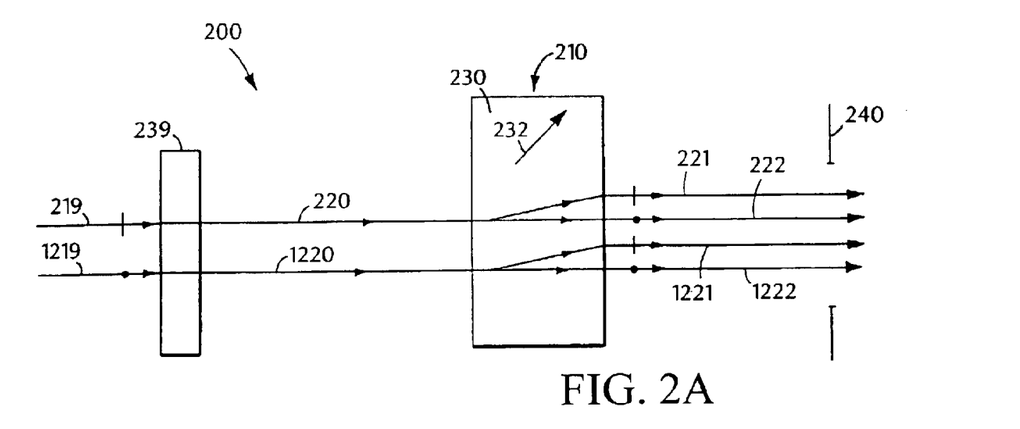
FIG. 2a is a schematic diagram of an embodiment of the anamorphic apparatus.

A first embodiment of anamorphic apparatus 35 is shown diagrammatically in FIG. 2a as anamorphic system 200. Anamorphic system 200 comprises a uniaxial crystal 230 and is shown for the non-limiting case of $n_o<n_e$ where $n_o$ and $n_e$ are the ordinary and extraordinary indices of refraction of the crystal. Uniaxial crystal 230 defines a first anamorphic cell 210. The optic axis 232 of crystal 230 is oriented at an angle of approximately 45 degrees with respect to the normal to the entrance facet of the cell 230. However, the orientation of optic axis 232 may be selected to be larger or less than 45 degrees according to requirements of an end use application.

Anamorphic system 200 is a heterodyne system wherein there is a known frequency shift between the two beams 219 and 1219 prior to beams 219 and 1219 entering anamorphic system 210. The planes of polarization of beams 219 and 1219 are orthogonal to each other. A polarizer 239 receives beams 219 and 1129 and mixes their polarizations so that they emerge as beams 220 and 1220, which have the same polariztion. In the presently described embodiment, the polarization of beams 220 and 1220 is oriented at angles of 45 degrees to the plane of FIG. 2a. Beams 220 and 1220 are preferably overlapped fully, i.e., they are coextensive beams.

More typically for interferometry applications, however, the beams overlap only partially and have a relative beam shear. Accordingly, beams 220 and 1220 are shown as spatially separated beams in FIG. 2a for the purpose of simplifying description of properties of anamorphic system 210 without departing from either the scope or spirit of the present invention.

Figure 2B:
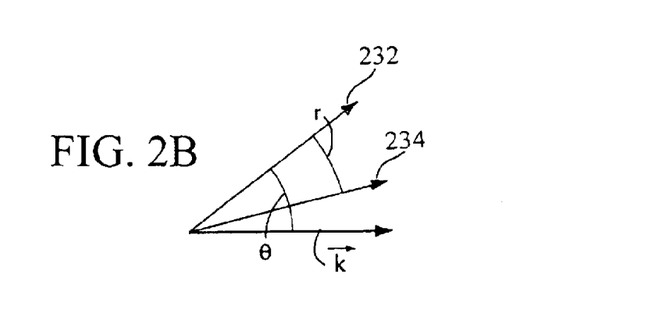
FIG. 2b shows vectors referred to in FIG. 2b.

Beam 220 is incident on crystal 230 with an angle of incidence substantially normal to the entrance facet of the crystal. The input and output facets of crystal 230 are substantially parallel. The extraordinary polarized component of beam 220 in crystal 230 "walks off" at an angle (r−θ) relative to the ordinary polarized component of beam 220 where r and θ are the angles between the energy flux vector 234 and the optic axis 232 and between the wavefront vector $\vec{k}$ and the optic axis 232, respectively. The relationship of energy flux vector 234, wavefront vector $\vec{k}$, and optic axis 232 are shown diagrammatically in FIG. 2b. The extraordinary and ordinary polarized components of beam 220 exit crystal 230 as beams 221 and 222, respectively. The thickness of crystal 230 is selected so as to introduce a predetermined lateral beam shear between beams 221 and 222 and to introduce a phase shift between beams 221 and 222 that is a multiple of 2π. The value of predetermined lateral shear is selected according to properties required of a central region of a beam overlap in an end use application with reduced wavefront errors.

Beam 1220 is transmitted by crystal 230 as beams 1221 and 1222. The description of beams 1221 and 1222 is the same as corresponding portions of the descriptions given for beams 221 and 222, respectively.

The central overlap regions of beams 221 and 222 and beams 1221 and 1222 have respective wavefront errors that are reduced with respect to the wavefront errors of beams 220 and 1220, respectively, as a result in each case of the superposition of two spatially sheared wavefronts that otherwise have the same wavefront errors. A portion of the central overlap regions is transmitted by stop 240. As a consequence, the effect a relative beam shear of beams 220 and 1220 and of the reduced wavefront errors in the transmitted portion of the overlap regions will generate reduced errors in a subsequently detected interferometric phase.

The reason why the errors in the detected interferometric phase will typically be reduced can be understood as follows.

The interferometric phase corresponds to the interference between the reference and measurement beam components in the output beam. When there is no lateral shear between these components and the components have identical wavefront errors, the wavefront errors cancel each other out when the components interfere with one another. When the interferometer causes a lateral shear between the reference and measurement beam components, however, the wavefront errors do completely cancel out. Because the wavefront error typically corresponds to lower order polynomial phase distributions (e.g., linear, quadratic, or cubic distributions) caused, for example, by flatness variations in the interferometer optics, the effect of any wavefront error on the detected interferometric phase increases with the lateral shear between the components. Likewise, when the reference and measurement beam components of the output beam do not have identical wavefront errors, the effect of any wavefront error on the detected interferometric phase similarly increases with the lateral shear between the components.

Superposing the original output wavefront with a sheared copy of the output wavefront, however, can produce a pair of reference and measurement beam components whose relative shear (i.e., transverse separation) is reduced relative to the shear between the reference and measurement beam components of the original output wavefront. In particular, if the shear between the reference and measurement components in the original output wavefront is "a," and the shear between the output wavefront and its copy is "b," then the resulting shear between the reference component of one wavefront and the measurement component of the other of wavefront is "a−b." Thus, provided b<2a, that pair of reference and measurement beam components has a reduced shear relative to that of the reference and measurement beam components of the original output wavefront. Because the shear is reduced, the effect of any wavefront error on the interference phase derived from this combination of reference and measurement beam components is reduced. The shear between the other combinations of the reference and measurement components is "a," a, and "a+b," respectively, and there may also be a contribution to the measured interference phase from these combinations. However, the amplitude of the resulting interference between any pair of reference and measurement beam components decreases with the shear between the pair as that shear approaches the beam width of the components, and thus the contribution from the first combination will dominate over these other combinations. Moreover, stop 240 can be positioned to reduce the contribution from these other combinations.

Figure 8:
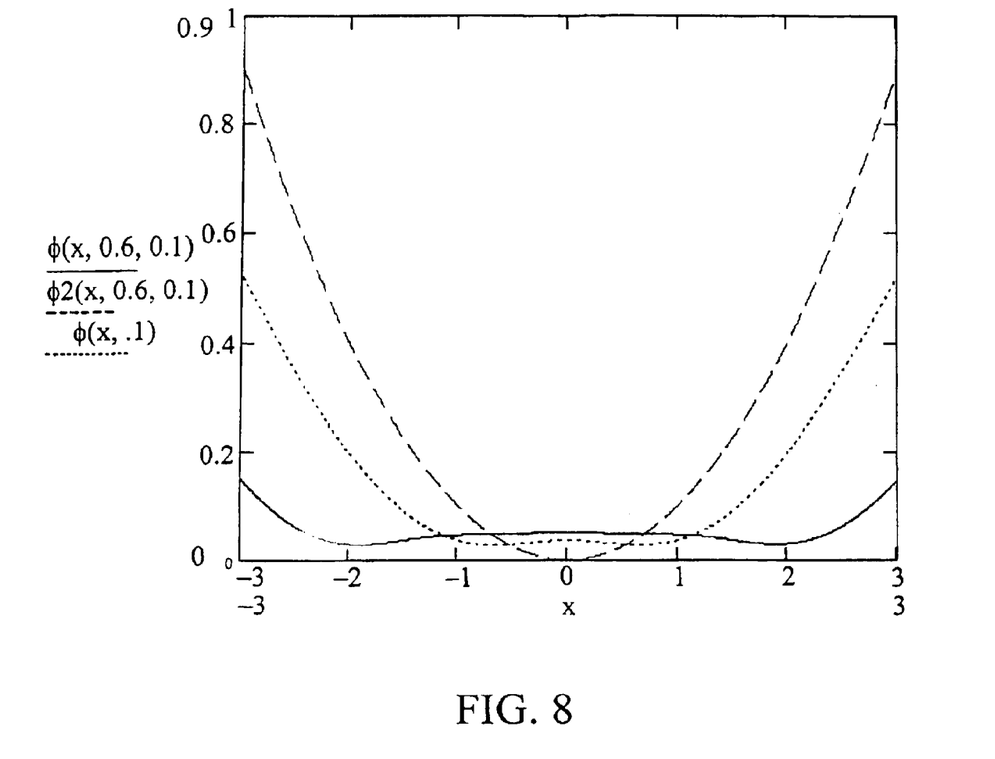
FIG. 8 is a plot illustrating the reduction of a quadratic wavefront distortion based the anamorphic apparatus described herein.

The reduction in wavefront errors can also be understand from the following specific example for a wavefront error corresponding to a quadratic phase distortion. Referring to the plot in FIG. 8, the dashed curve shows a quadratic phase distortion φ(x) as a function of transverse position "x" for a beam having a Gaussian transverse amplitude distribution. The dotted curve shows the resulting phase distribution Φ(x) when the Gaussian beam is superposed with a sheared replica of itself, where the shear is 0.6 of the 1/e radius of the Gaussian beam. As shown in the FIG. 8, the result for the dotted curve is to "flatten" the phase distortion in a central region of the sheared beams. Thus, the anamorphic system can flatten the phase distortion in each of the reference and measurement beam components. As will be described further below in subsequent embodiments, the flattening can be further enhanced when the anamorphic system is cascaded with one or more additional anamorphic system. For example, referring again to FIG. 8, the solid curve shows the phase distribution $\Phi_2(x)$ for the Gaussian beam when it is superposed with three additional replicas of itself each of which is sheared relative to the adjacent beam by 0.6 of the 1/e radius of the Gaussian beam. As shown in FIG. 8, the superposition of additional sheared replicas of the beam further reduces (e.g., flattens) the phase distortion in the central region. Notably, any constant transverse phase term caused by the superposition simply adds a constant phase offset term to the distance measuring interference signal.

Figure 3A:
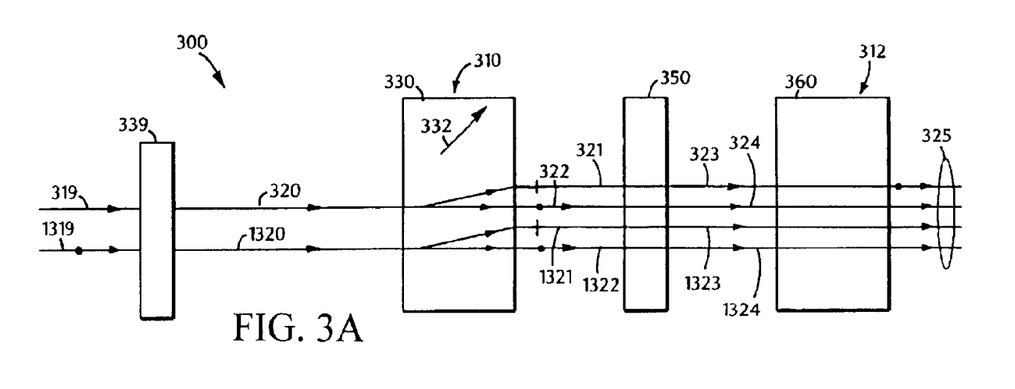
FIGS. 3a and 3b is a schematic diagram of another embodiment of the anamorphic apparatus.
Figure 3B:
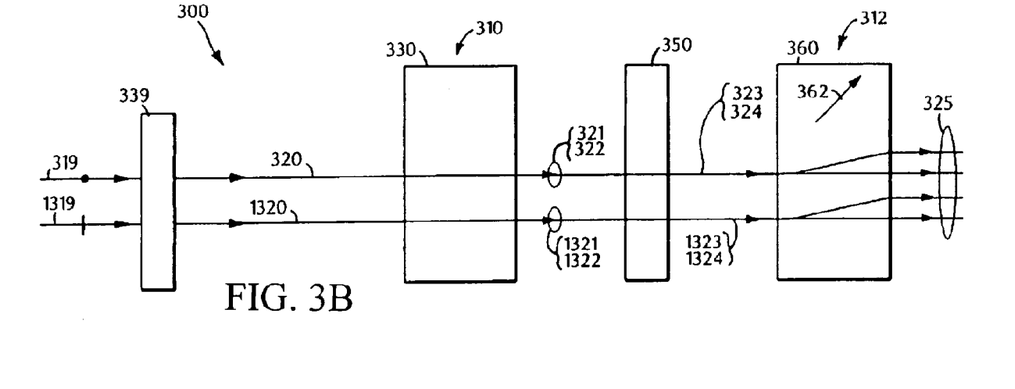

A second embodiment of anamorphic apparatus 35 is shown diagrammatically in FIGS. 3a and 3b as anamorphic system 300. The plane of FIG. 3b is orthogonal to the plane of FIG. 3a. System 300 comprises two anamorphic cells 310 and 312, a polarizer 339, and a half wave phase retardation plate 350 to reduce sensitivity of a measured interferometric phase to the effects of beams having wavefront errors and lateral shears of two beams in two orthogonal directions. The descriptions of anamorphic cells 310 and 312 are the same as corresponding portions of the description given for anamorphic cell 210 of the first embodiment except that the planes of the optic axes of anamorphic cells 310 and 312 are orthogonal.

Half wave phase retardation plate 350 is oriented so that the planes of polarization of beams 321, 322, 1321, and 1322 out of anamorphic cell 310 are rotated by 45 degrees before entering anamorphic system 312 as beams 323, 324, 1323, and 1324. As a result of the rotation of the planes of polarization, each of the beams entering anamorphic cell 312 exit anamorphic cell 312 as two beams with orthogonal polarizations that are spatially sheared relative to each other. The direction of the respective shears introduced by anamorphic cell 312 is orthogonal to the direction of the respective shears introduced by anamorphic cell 310. The output beam of anamorphic cell 312 comprises 8 beams. The net effect of the two sets of beam shears introduced by anamorphic cells 310 and 312 and half-wave phase retardation plate 350 is to produce a central overlap region with reduced wavefront errors with respect to two orthogonal axes.

The remaining description of the second embodiment is the same as corresponding portions of the description given for the first embodiment.

In one variant of the second embodiment, half wave phase retardation plate 350 may be replaced with a quarter wave phase retardation plate. In another variant of the second embodiment, half wave phase retardation plate 350 is removed and anamorphic cell 312 is rotated by 45 degrees out of the plane of FIG. 3a.

Figure 4:
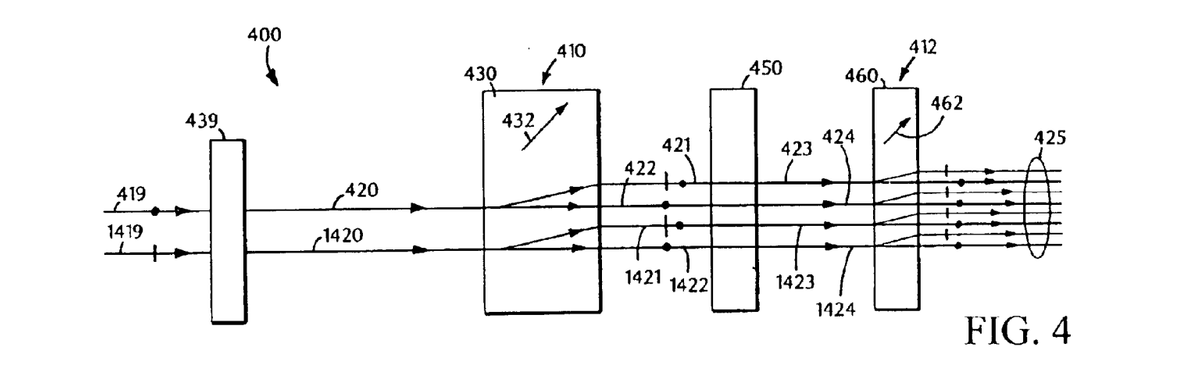
FIG. 4 is a schematic diagram of a further embodiment of the anamorphic apparatus.

A third embodiment of anamorphic apparatus 35 is shown diagrammatically in FIG. 4 as anamorphic system 400. The third embodiment comprises two anamorphic cells 410 and 412, polarizer 439, and a half-wave phase retardation plate 450 to reduce sensitivity of a measured interferometric phase to the effects of beams having wavefront errors and lateral shear of two beams in one direction. The central overlap regions with reduced wavefront errors is larger for the third embodiment relative to that of the first embodiment.

The descriptions of anamorphic cells 410 and 412 of the third embodiment are the same as corresponding portions of the description given for the anamorphic cell 210 of the first embodiment except that the lateral shear produced by the walk off in anamorphic cell 412 is, for example, one half that of anamorphic system 410. Half wave phase retardation plate 450 is oriented so that the planes of polarization of the beams 421, 422, 1421, and 1422 out of anamorphic cell 410 are rotated by 45 degrees to form beams 423, 424, 1423, and 1424, respectively, before entering anamorphic cell 412. As a result of the rotation of the planes of polarization, each of the beams 423, 424, 1423, and 1424 entering anamorphic cell 412 exit anamorphic cell 412 as two beams with orthogonal polarizations that are spatially sheared relative to each other. The output beam 425 of anamorphic cell 412 comprises eight beams.

The presence of four spatially sheared beams for each input beam generates a central overlap region in output beam 425 that can be larger for the third embodiment relative to that of the first embodiment for a similar level of reduction of wavefront errors or that can have a central overlap region of size similar to that of the first embodiment but with a net effect of wavefront errors further reduced compared to that achieved in the first embodiment.

The remaining description of the third embodiment is the same as corresponding portions of the description given for the first embodiment.

In one variant of the third embodiment, half wave phase retardation plate 450 may be replaced with a quarter wave phase retardation plate.

Figure 5:
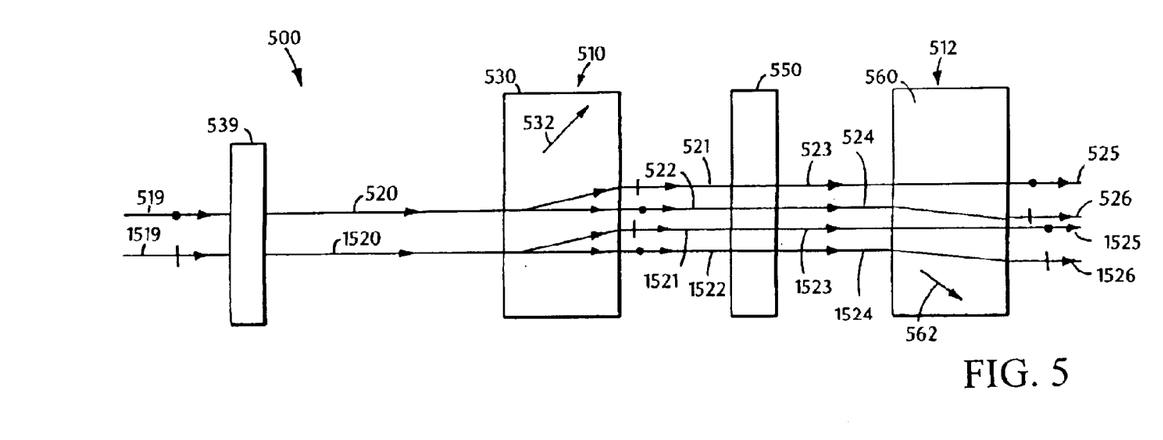
FIG. 5 is a schematic diagram of a further embodiment of the anamorphic apparatus.

A fourth embodiment of anamorphic apparatus 35 is shown diagrammatically in FIG. 5 as anamorphic system 500. The fourth embodiment of the present invention comprises two anamorphic cells 510 and 512, a polarizer 539, and a half-wave phase retardation plate 550. The descriptions of anamorphic cells 510 and 512 of the fourth embodiment are the same as corresponding portions of the description given for anamorphic cells 210 of the first embodiment except for the directions of optic axes 532 and 562 of anamorphic cells 510 and 512, respectively. In the fourth embodiment, anamorphic cells 510 and 512 and half-wave phase retardation plate 550 are arranged so that there are two beams generated for each input beam 520 and 1520 and that each output beam 525, 526, 1525, and 1526 has travel through the same paths as ordinary and extraordinary polarized beams. The similar paths as ordinary and extraordinary polarized beams significantly reduce sensitivity to changes in temperature of the components of the fourth embodiment.

The remaining description of the fourth embodiment is the same as corresponding portions of the description given for the first embodiment.

The phase retardation plates in the different embodiments may comprise birefringent crystals such as quartz or polymers.

For all of the embodiments of the present invention, the anamorphic systems can be made small by reducing the diameter of input beams using for example Galilean or Newtonian optical systems. For a launch into a fiber optic, the input beam diameter can be of the order of 50 microns leading to a significant reduction in the size of the anamorphic systems.

It will be evident to those skilled in the art that stops may be added to each of the second, third, and fourth embodiments such as described for the first embodiment without departing from either the scope or spirit of the present invention. The addition of a stop further reduces the effect a relative beam shear of respective input beams and of the reduced wavefront errors in portions of the overlap regions transmitted by the stops in a subsequently detected interferometric phase.

Interferometry systems that incorporate any of the anamorphic systems described above increase the accuracy of the interferometer by reducing non-cyclic non-linearities in the interferometric signal. As a result, such interferometry systems provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 6A:
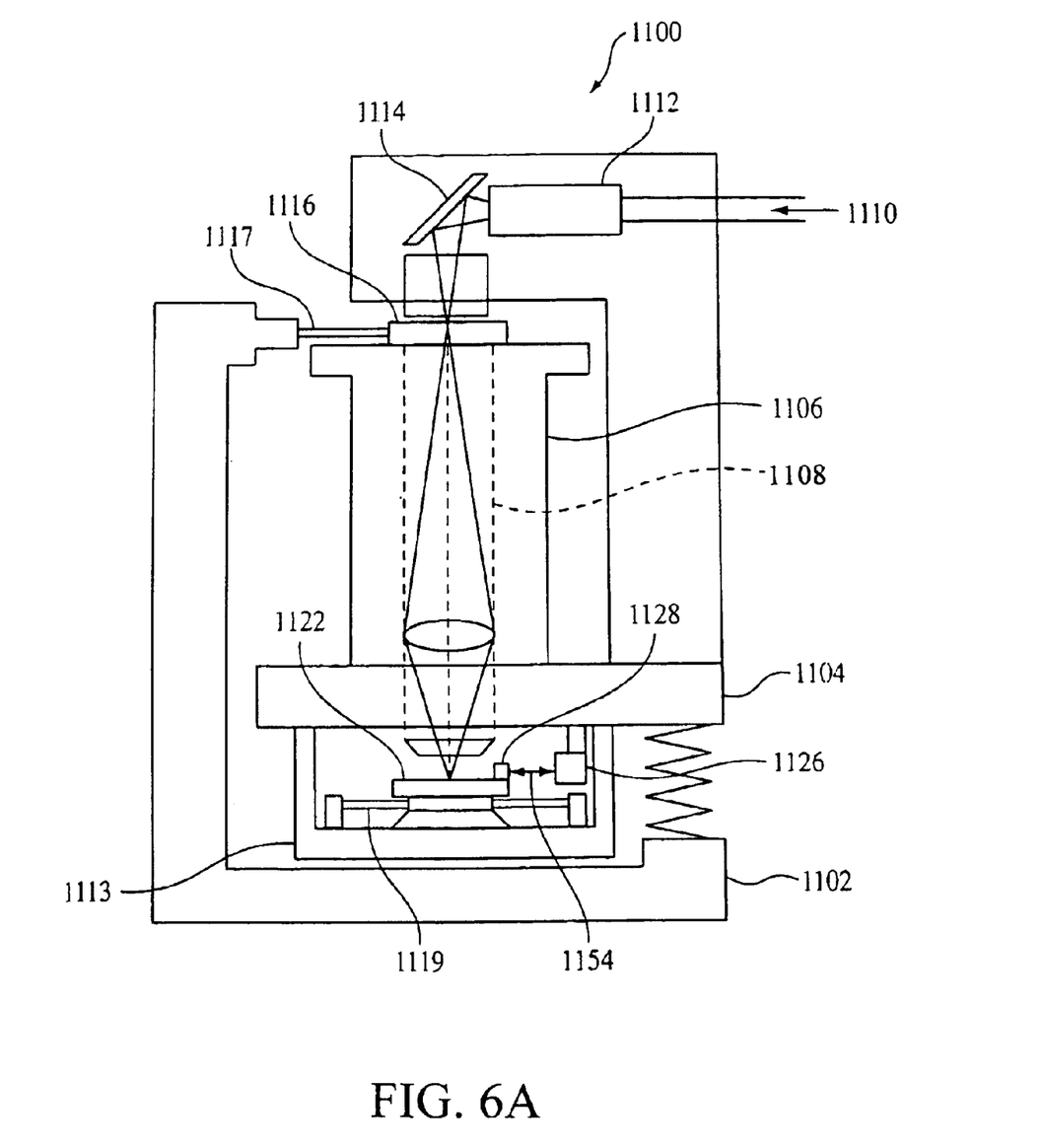
FIG. 6a is schematic diagram of a lithography system that includes an interferometry system described herein and is used to make integrated circuits.

An example of a lithography scanner 1100 using an interferometry system 1126 is shown in FIG. 6a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6B:
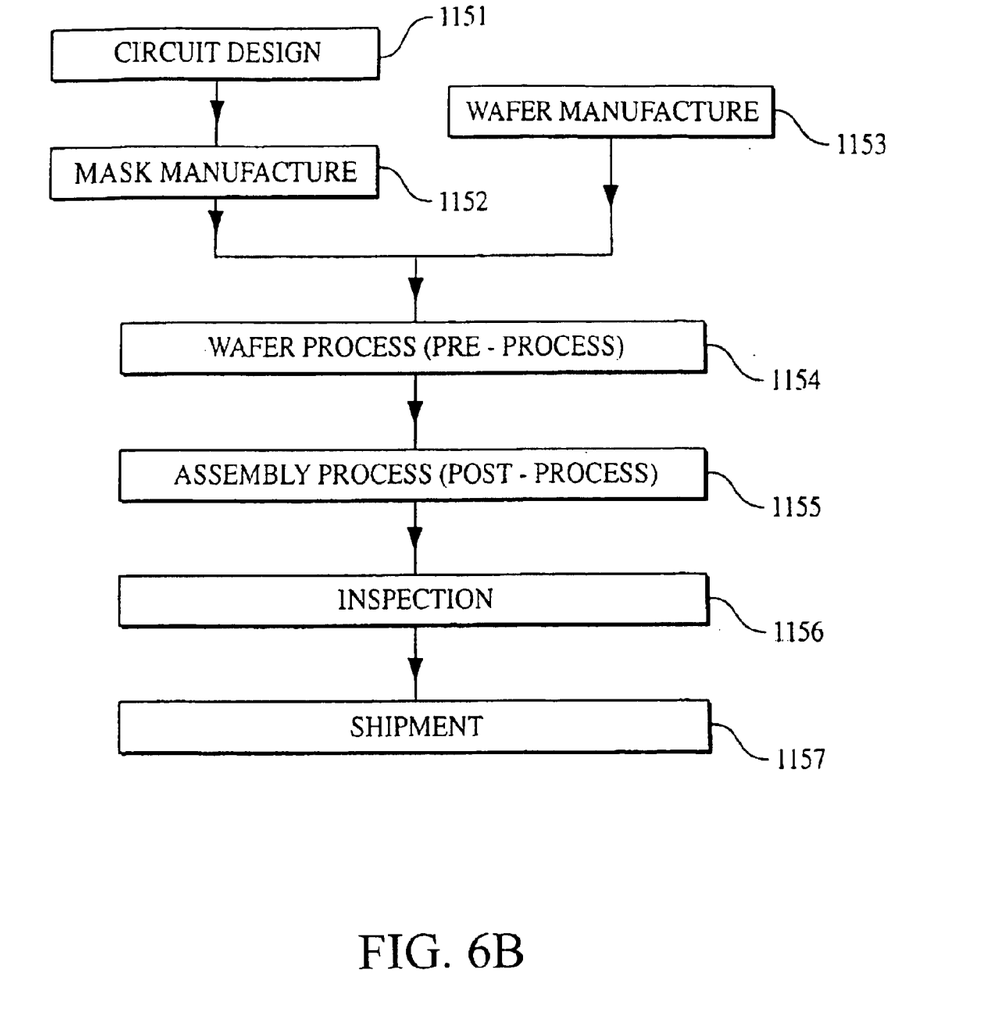
FIGS. 6b–c are flow charts that described steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 6b and 6c. FIG. 6b is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 6C:
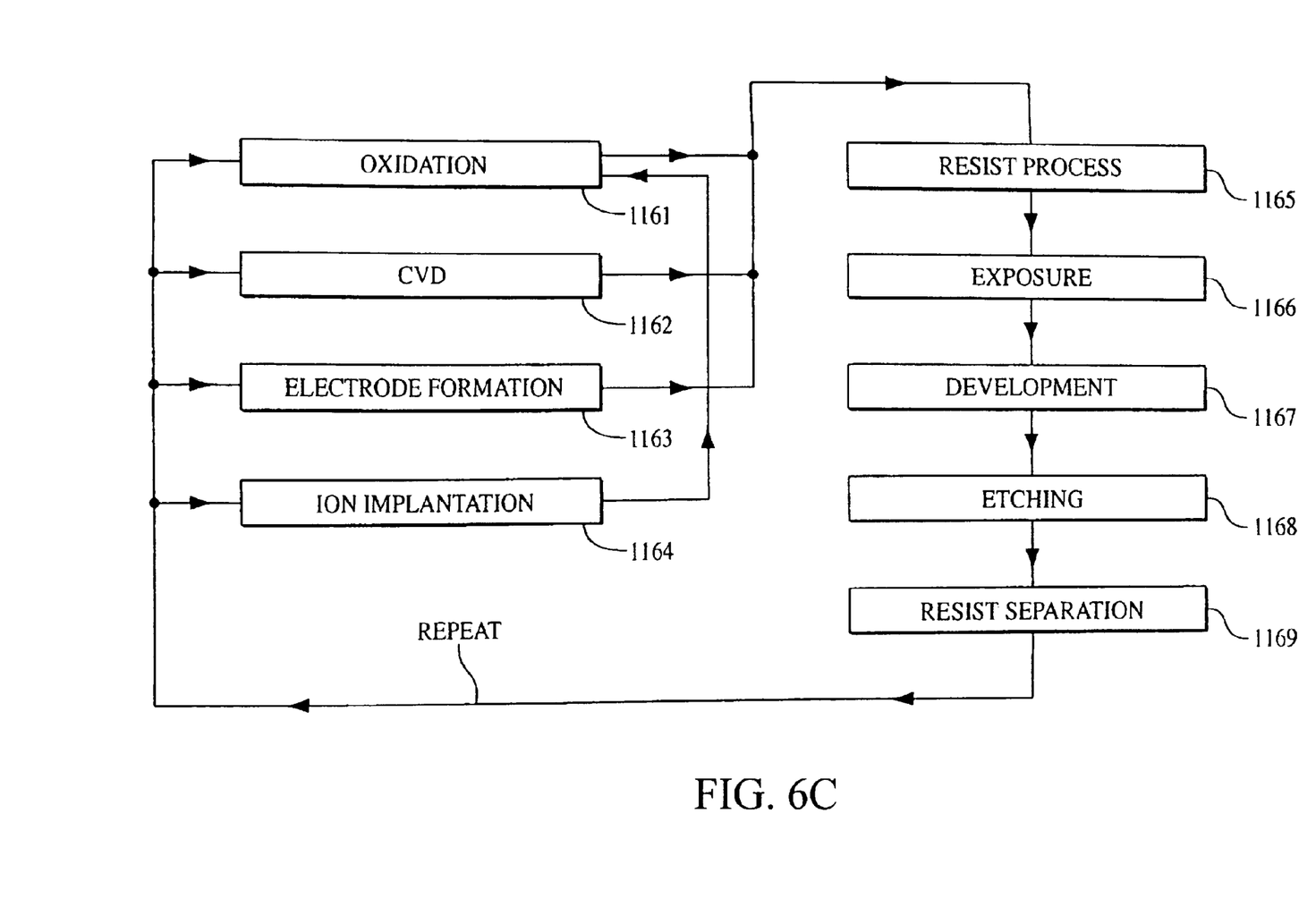

FIG. 6c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
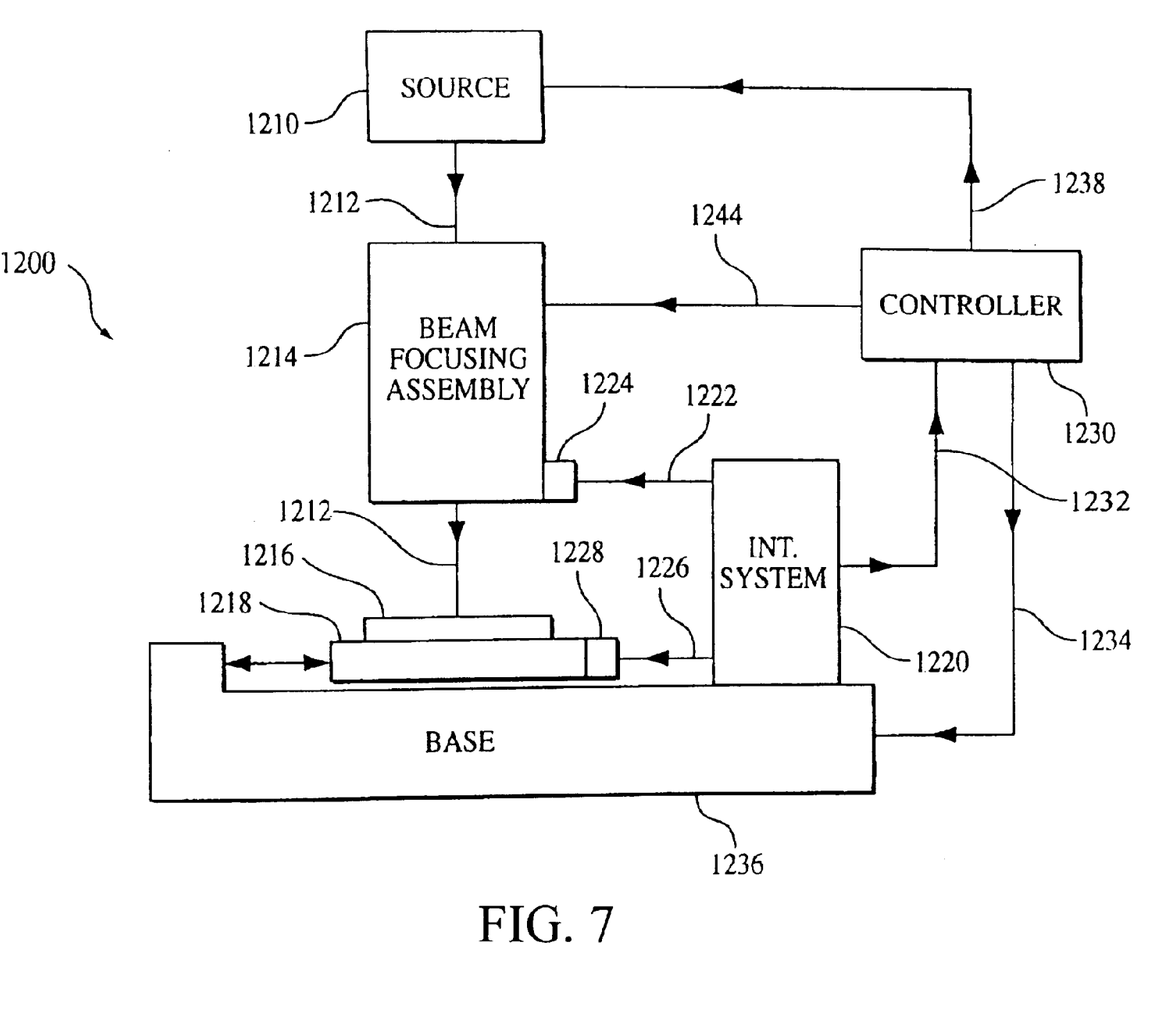
FIG. 7 is a schematic of a beam writing system that includes an interferometry system described herein.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. An interferometry system comprising:
    an interferometer which during operation directs a reference beam along a reference path and a measurement beam along a measurement path and recombines at least a portion of each of the beams to form an overlapping pair of exit beams;

a detector which during operation measures an interference signal derived from the overlapping pair of exit beams; and an anamorphic system positioned to received the overlapping pair of exit beams and reduce the effects of relative beam shear and wavefront errors on the interference signal measured by the detector, wherein the anamorphic system comprises an anamorphic cell comprising a birefringent optic.

2. The interferometry system of claim 1, wherein the birefringent optic is a uniaxial crystal.

3. The inteferometry system of claim 1, wherein the birefringent optic is shaped to define ordinary and extraordinary paths for each of the exit beams.

4. The inteferometry system of claim 3, wherein the ordinary and extraordinary paths introduce a lateral shear between orthogonally polarized components of each of the exit beams.

5. The inteferometry system of claim 4, wherein the ordinary and extraordinary paths introduce a phase shift that is a multiple of $2\pi$ between the orthogonally polarized components.

6. The interferometry system of claim 3, wherein the anamorphic system further comprises a polarizer positioned prior to the anamorphic cell and oriented to cause each of the exit beams to have the same polarization prior to their propagation into the anamorphic cell.

7. The interferometry system of claim 3, wherein the anamorphic system further comprises a stop positioned to transmit only a central portion of the beams emerging from the anamorphic cell.

8. The interferometry system of claim 1, wherein the anamorphic system comprising a second anamorphic cell comprising a birefringent optic.

9. The interferometry system of claim 8, wherein the second anamorphic cell defines anamorphic axes oriented differently from those defined by the first anamorphic cell.

10. The interferometry system of claim 8, wherein the anamorphic system further comprises a wave plate positioned between the first and second anamorphic cells.

11. The interferometry system of claim 10, wherein the wave plate is a half wave plate.

12. The interferometry system of claim 10, wherein the wave plate is a quarter wave plate.

13. The interferometry system of claim 8, wherein the first anamorphic cell is configured to introduce a first lateral shear between orthogonally polarized components of each of the exit beams, and the second anamorphic cell is configured to introduce a second lateral shear between orthogonally polarized components of each of the components emerging from the first anamorphic cell.

14. The interferometry system of claim 13, wherein the first lateral shear and the second lateral shear are along different directions.

15. The interferometry system of claim 14, wherein the first lateral shear and the lateral shear are along orthogonal directions.

16. The interferometry system of claim 13, wherein the first lateral shear and the second lateral shear are along a common direction, and the magnitude of the second lateral shear is about half that of the first lateral shear.

17. The interferometry system of claim 13, wherein the first anamorphic cell introduces a phase shift that is a multiple of $2\pi$ between the orthogonally polarized components of the input beam, and the second anamorphic cell introduces a phase shift that is a multiple of $2\pi$ between each of the components emerging from the first anamorphic cell.

18. The interferometry system of claim 13, wherein the anamorphic system further comprises a wave plate positioned between the first and second anamorphic cells.

19. The interferometry system of claim 13, further comprises a polarizer positioned prior to the first anamorphic cell and oriented to cause each of the exit beams to have the same polarization prior to their propagation into the first anamorphic cell.

20. The interferometry system of claim 8, wherein the first anamorphic cell defines an ordinary path and an extraordinary path for orthogonally polarized components of each of the exit beams, and wherein the second anamorphic cell defines an ordinary path for each of the components that propagate along an extraordinary path in the first anamorphic cell and defines an extraordinary path for each of the components that propagate along an ordinary path in the first anamorphic cell.

21. The interferometry system of claim 20, wherein the anamorphic system further comprises a wave plate positioned between the first and second anamorphic cells.

22. The interferometry system of claim 21, further comprises a polarizer positioned prior to the first anamorphic cell and oriented to cause each of the exit beams to have the same polarization prior to their propagation into the first anamorphic cell.

23. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and the interferometry system of claim 1 for measuring the position of the stage.

24. A lithography system for use in fabricating integrated circuits on a wafer, the system comprising:

a stage for supporting the wafer; and an illumination system including a radiation source, a mask, a positioning system, a lens assembly, and the interferometry system of claim 1, wherein during operation the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

25. A lithography system for fabricating integrated circuits comprising first and second components, the first and second components being movable relative to each other, and the interferometry system of claim 1, wherein the first component comprises a measurement object positioned along the measurement path and the interferometry system measures the position of the first component relative to the second component.

26. A lithography system for fabricating integrated circuits comprising first and second components, the first and second components being movable relative to each other, and the interferometry system of claim 1, wherein the first component comprises a measurement object contacted by the measurement path and the second component is contacted by the reference path, and wherein the interferometry system measures the relative position of the first and second components.

27. A beam writing system for use in fabricating a lithography mask, the system comprising:
 a source providing a write beam to pattern a substrate;
 a stage supporting the substrate;
 a beam directing assembly for delivering the write beam to the substrate;
 a positioning system for positioning the stage and beam directing assembly relative one another; and
 the interferometry system of claim 1 for measuring the position of the stage relative to the beam directing assembly.

* * * * *